United States Patent
Lu

(10) Patent No.: US 11,452,217 B2
(45) Date of Patent: Sep. 20, 2022

(54) HOUSING DEVICE WITH COMBINATION STRUCTURES

(71) Applicant: Chicony Power Technology Co., Ltd., New Taipei (TW)

(72) Inventor: Wen-Yung Lu, New Taipei (TW)

(73) Assignee: CHICONY POWER TECHNOLOGY CO., LTD., New Taipei (TW)

( * ) Notice: Subject to any disclaimer, the term of this patent is extended or adjusted under 35 U.S.C. 154(b) by 402 days.

(21) Appl. No.: 16/748,824

(22) Filed: Jan. 22, 2020

(65) Prior Publication Data
US 2021/0127505 A1   Apr. 29, 2021

(30) Foreign Application Priority Data

Oct. 25, 2019  (TW) .................................. 108138674

(51) Int. Cl.
*H05K 5/00* (2006.01)
*H01R 13/506* (2006.01)
*H05K 5/06* (2006.01)

(52) U.S. Cl.
CPC ......... *H05K 5/0013* (2013.01); *H01R 13/506* (2013.01); *H05K 5/063* (2013.01); *H05K 5/069* (2013.01)

(58) Field of Classification Search
CPC ...... H05K 5/0013; H05K 5/063; H05K 5/069; H01R 13/506; H01R 2103/00; H01R 24/68; H01R 13/504
See application file for complete search history.

(56) References Cited

U.S. PATENT DOCUMENTS 5,672,078 A * 9/1997 Fukamachi .......... H01R 13/518
                                                    439/701
6,168,476 B1 * 1/2001 Yang .................. H01R 13/6581
                                                    439/352
(Continued)

FOREIGN PATENT DOCUMENTS

AU     2018101463 A4    10/2018
AU     2018101458 A4    11/2018
(Continued)

OTHER PUBLICATIONS

Office Action dated Sep. 11, 2020 of the corresponding Taiwan patent application No. 108138674.
(Continued)

*Primary Examiner* — James Wu
*Assistant Examiner* — Sagar Shrestha
(74) *Attorney, Agent, or Firm* — Chun-Ming Shih; HDLS IPR Services

(57) ABSTRACT

A housing device includes a first housing body. The first housing body includes a first housing seat and a first combination structure. The first housing seat has a first bottom surface, a first wall and an extension wall. The first wall and the extension wall are respectively extended from the first bottom surface in a direction away from the first bottom surface, and the extension wall is located at an inner side of the first wall and higher than the first wall. The first combination structure includes a hook, a base and a first bump provided as an energy director. The hook is disposed at a side of the extension wall facing the first wall. The base is protruded from the first wall and located below the hook correspondingly, and the first bump is disposed on the base.

10 Claims, 12 Drawing Sheets

(56) References Cited

U.S. PATENT DOCUMENTS

| | | | |
|---|---|---|---|
| 6,290,551 B1 | 9/2001 | Nguyen | |
| 6,492,590 B1* | 12/2002 | Cheng | H01R 13/6658 52/27 |
| 6,891,104 B2* | 5/2005 | Dinh | H02G 3/14 439/11 |
| 6,893,295 B1* | 5/2005 | Lloyd | H01R 12/772 439/465 |
| 7,179,105 B1 | 2/2007 | Hung | |
| 7,344,385 B2* | 3/2008 | Chen | H05K 3/32 439/74 |
| 7,591,690 B1* | 9/2009 | Chien | H02S 40/34 439/842 |
| 8,003,885 B2* | 8/2011 | Richter | H01R 4/28 174/64 |
| 8,197,263 B2* | 6/2012 | Rueggen | H02S 40/34 439/76.1 |
| 8,345,430 B2 | 1/2013 | Tochi et al. | |
| 8,403,711 B2* | 3/2013 | Xue | H02S 40/34 439/709 |
| 8,512,050 B2* | 8/2013 | McGreevy | H02S 40/34 439/76.1 |
| 9,281,141 B2 | 3/2016 | Rochlitz et al. | |
| 9,325,098 B2* | 4/2016 | Chen | H01R 13/44 |
| 9,680,292 B2* | 6/2017 | Wijaya | H02G 3/14 |
| 10,148,074 B1* | 12/2018 | Matsumura | H05K 5/0221 |
| 10,624,221 B1* | 4/2020 | Lin | H05K 5/0086 |
| 10,645,821 B1* | 5/2020 | Cheng | H01R 13/516 |
| 2006/0089034 A1* | 4/2006 | Chen | H05K 5/06 439/164 |
| 2007/0059979 A1* | 3/2007 | Yang | H05K 5/063 439/540.1 |
| 2008/0105525 A1* | 5/2008 | Chen | H01R 13/6278 200/318.2 |
| 2010/0089604 A1* | 4/2010 | Tang | H05K 5/0013 174/50 |
| 2015/0296636 A1* | 10/2015 | Wang | H02S 40/32 361/736 |
| 2018/0351314 A1* | 12/2018 | Hsu | H01R 13/506 |
| 2021/0119359 A1* | 4/2021 | Nagasaka | H01R 9/16 |

FOREIGN PATENT DOCUMENTS

| | | |
|---|---|---|
| CN | 1578340 A | 2/2005 |
| CN | 201994453 U | 9/2011 |
| CN | 107442925 A | 12/2017 |
| CN | 207040051 U | 2/2018 |
| CN | 207266472 U | 4/2018 |
| TW | 200614901 A | 5/2006 |
| TW | I336536 B | 1/2011 |
| TW | I497835 B | 8/2015 |
| TW | I633826 B | 8/2018 |
| TW | 201904370 A | 1/2019 |

OTHER PUBLICATIONS

Office Action dated Jan. 7, 2022 of the corresponding China patent application No. 201911084102.5.

* cited by examiner

HOUSING DEVICE WITH COMBINATION STRUCTURES

BACKGROUND OF THE INVENTION

Field of the Invention

The present invention generally relates to a plastic housing and, in particular to a housing device with combination structures.

Description of Prior Art

A housing device of a product not only maintains the appearance of the product, but also provides functions such as accommodating electrical components. In addition, materials of the housing device generally can be divided into metal or plastic. For plastic materials, the housing device is mostly composed of two shells which are combined with each other, wherein, the two shells are separately formed by injection molding and combined by means of snapping, locking or bonding, thereby the assembly of the product is completed.

Moreover, the fixing methods of traditional housing devices are very time consuming and difficult to disassemble in the assembly process, and now the fixing method is processed by hooks and ultrasonic welding. However, the hook structures of conventional shells are directly protruded from the wall of the shell. In order to avoid the formation of barbs or interference during injection molding that may not be demolded, traditional housings cannot form ultrasonic welding structures under hooks. Therefore, conventional housings cannot perform ultrasonic welding at the positions of hooks, so that the ultrasonic welding cannot be performed on the entire circumference of the housing, and that leads to the structural strength of the housing at the position of hooks is weak and easily damaged.

In view of the above drawbacks, the Inventor proposes the present invention based on his expert knowledge and elaborate researches in order to solve the problems of prior art.

SUMMARY OF THE INVENTION

Accordingly, an object of the present invention is to provide a housing device with combination structures, wherein the ultrasonic welding can be performed at the entire circumference of the housing device, and the structural strength of the hooks can be enhanced; therefore, the reliability of the housing device will be improved.

In order to achieve the object mentioned above, the present invention provides a housing device with combination structures including a first housing body. The first housing body includes a first housing seat and a first combination structure. The first housing seat has a first bottom surface, a first wall and an extension wall. The first wall and the extension wall are respectively extended from the first bottom surface in a direction away from the first bottom surface, and the extension wall is located at an inner side of the first wall and higher than the first wall. The first combination structure includes a hook, a base and a first bump provided as an energy director. The hook is disposed at a side of the extension wall facing the first wall. The base is protruded from the first wall and located below the hook correspondingly, and the first bump is disposed on the base.

In order to achieve the object mentioned above, the present invention provides a housing device with combination structures including a first housing body. The first housing comprises a first housing seat a first housing seat and a first combination structure. The first housing seat has a first bottom surface and a first wall, the first wall extended from the first bottom surface in a direction away from the first bottom surface. The first combination structure includes a hook, a base and a first bump provided as an energy director. The hook is protruded from the first wall; the base is protruded from the first wall and located below the hook correspondingly, and the first bump is disposed on the base.

Comparing to the prior art, the first housing seat of the housing device of the present invention has formed a first wall and an extension wall, and the extension wall is located at an inner side of the first wall and higher than the first wall; in addition, the first housing seat has further comprises a first combination structure including a hook, a base and a first bump provided as an energy director. Moreover, the hook is disposed at the extension wall. The base is protruded from the first wall and located below the hook correspondingly, and the first bump is disposed on the base. Furthermore, the housing device further includes a second housing body combined with the first housing body. Besides, the second housing seat further comprises a second combination structure including a slot and an abutting block. Thereby, the second bump of the second housing body is inserted in the groove of the first housing body for ultrasonic welding and bonded through melting the second bump where the first wall and the second wall are not provided with hooks. On the other hand, the ultrasonic welding can also be performed on the first housing body and the second housing body at the place where the hooks are provided, wherein the second housing body engages the hook of the first housing body through the slot and abuts the base of the first housing body through the abutting block for positioning. When the first housing body is combined with the second housing body by the ultrasonic welding, the base and the abutting block are bonded through melting the first bump. Thereby, the ultrasonic welding can be performed on the entire circumference between the first housing body and the second housing body for enhancing the structural strength of combination therebetween to improve the reliability of the housing device.

BRIEF DESCRIPTION OF DRAWINGS

The features of the invention believed to be novel are set forth with particularity in the appended claims. The invention itself, however, may be best understood by reference to the following detailed description of the invention, which describes a number of exemplary embodiments of the invention, taken in conjunction with the accompanying drawings, in which:

DETAILED DESCRIPTION OF THE PREFERRED EMBODIMENTS

In cooperation with attached drawings, the technical contents and detailed description of the invention are described thereinafter according to a number of preferable embodiments, being not used to limit its executing scope. Any equivalent variation and modification made according to appended claims is all covered by the claims claimed by the present invention.

Figure 1:
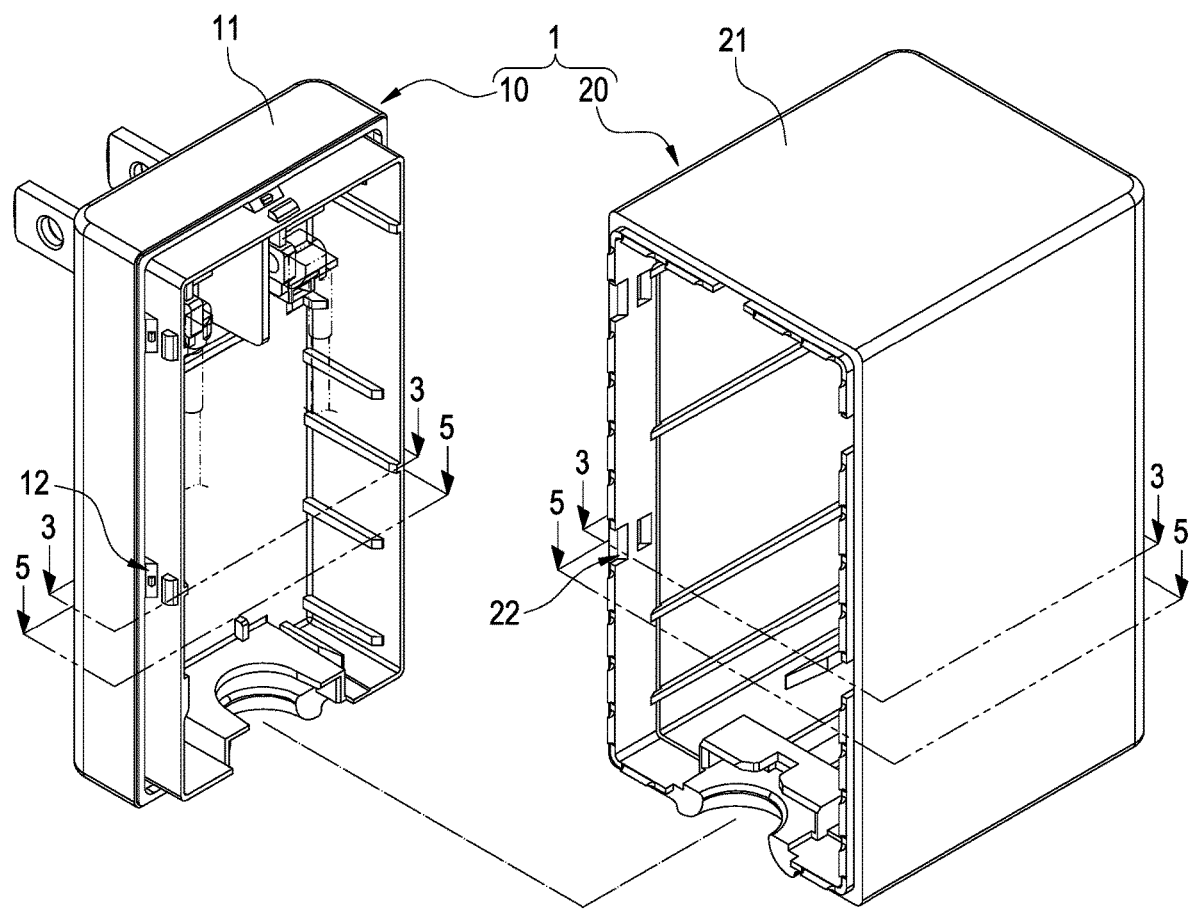
FIG. 1 is a perspective explosion schematic view of the housing device with combination structures of the present invention.

Please refer to FIG. 1, which depicts a perspective explosion schematic view of the housing device with combination structures of the present invention. A housing device 1 with combination structures of the present invention includes a first housing body 10 and a second housing body 20. The first housing body 10 comprises a first housing seat 11 and a first combination structure 12. The second housing body 20 comprises a second housing seat 21 and a second combination structure 22. Besides, the first housing body 10 and the second housing body 20 are held together through the deposition of the first combination structure 12 and the second combination structure 22 by ultrasonic welding. In the embodiment, the housing device 1 is, but not limited to, a power converter housing. More detail descriptions of the housing device 1 are as follows. It should be noted that, the housing device 1 in FIG. 1 has a 3-3 cross sectional line at the periphery of the housing device 1 with the hook and a 5-5 cross sectional line at the periphery of the housing device 1 without the hook.

Figure 2:
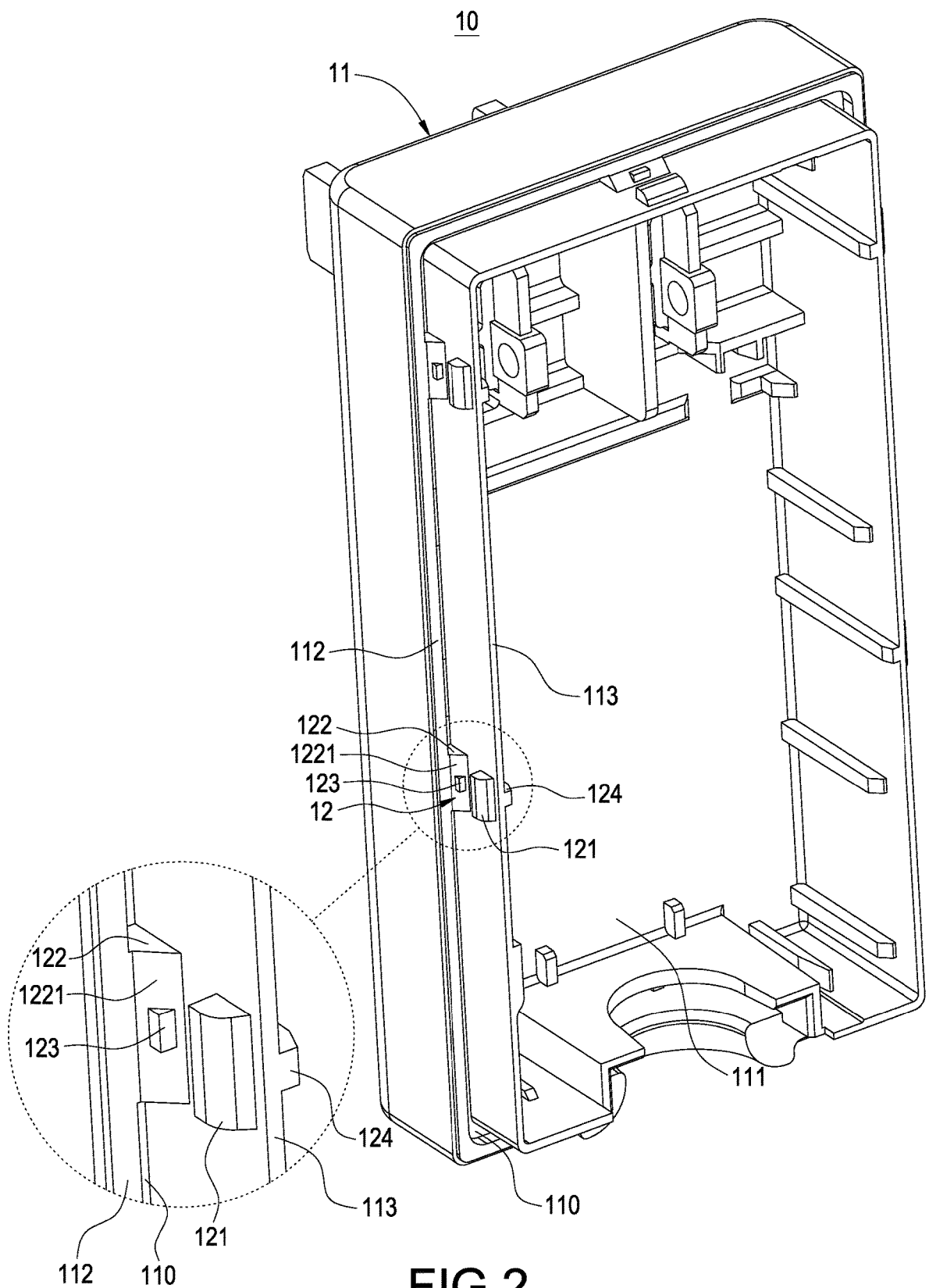
FIG. 2 is a perspective schematic view of the first housing body of the present invention.

Please refer to FIG. 2, which depicts a perspective schematic view of the first housing body of the present invention. The first housing body 10 includes a first housing seat 11 and a first combination structure 12 disposed on the first housing seat 11. In the present invention, the first housing seat 11 is a rectangular seat; the first housing seat 11 has a first bottom surface 111, a first wall 112 and an extension wall 113. The first wall 112 and the extension wall 113 are respectively extended from the first bottom surface 111 in a direction away from the first bottom surface 111, and the extension wall 113 is located at an inner side of the first wall 112 and higher than the first wall 112.

It is worth noticing that, in an embodiment of the present invention, the first housing seat 11 has a groove 110 located between the extension wall 113 and the first wall 112. The groove 110 is disposed for combining and positioning another housing body, and that will be described in detail later.

Moreover, the first combination structure 12 includes a hook 121, a base 122 and a first bump 123 provided as an energy director, wherein the energy director is a triangular section molded on one of the joint parts, and the purpose of energy directors is to ensure that sufficient amount of material is melted as they fill out the gap between mating parts Besides, the hook 121 is disposed at a side of the extension wall 113 facing the first wall 112. The base 122 is protruded from the first wall 112 and located below the hook 121 correspondingly, and the first bump 123 is disposed on the base 122.

Preferably, the first combination structure 12 further includes a reinforcing rib 124 positioned at a side of the extension wall 113 away from the first wall 112 and is disposed at a location corresponding to the hook 121. In the present embodiment, the reinforcing rib 124 extends from the first bottom surface 111 along the extension wall 113 to the rear side of the hook 121.

In addition, the base 122 has an inclined surface 1221, and the first bump 123 is disposed on the inclined surface 1221. In the present embodiment, the base 122 is disposed in the groove 110 and connected a side of the first wall 112, and the base 122 is extended from the groove 110 to protrudes the first wall 112.

It should be noted that, in this embodiment, the periphery of the first housing seat 11 is provided with a plurality of hooks 121 and a plurality of bases 122 with respect to the hooks 121. Further, the grooves 110 are disposed at the periphery of the first housing seat 11 without hooks 121.

Figure 3:
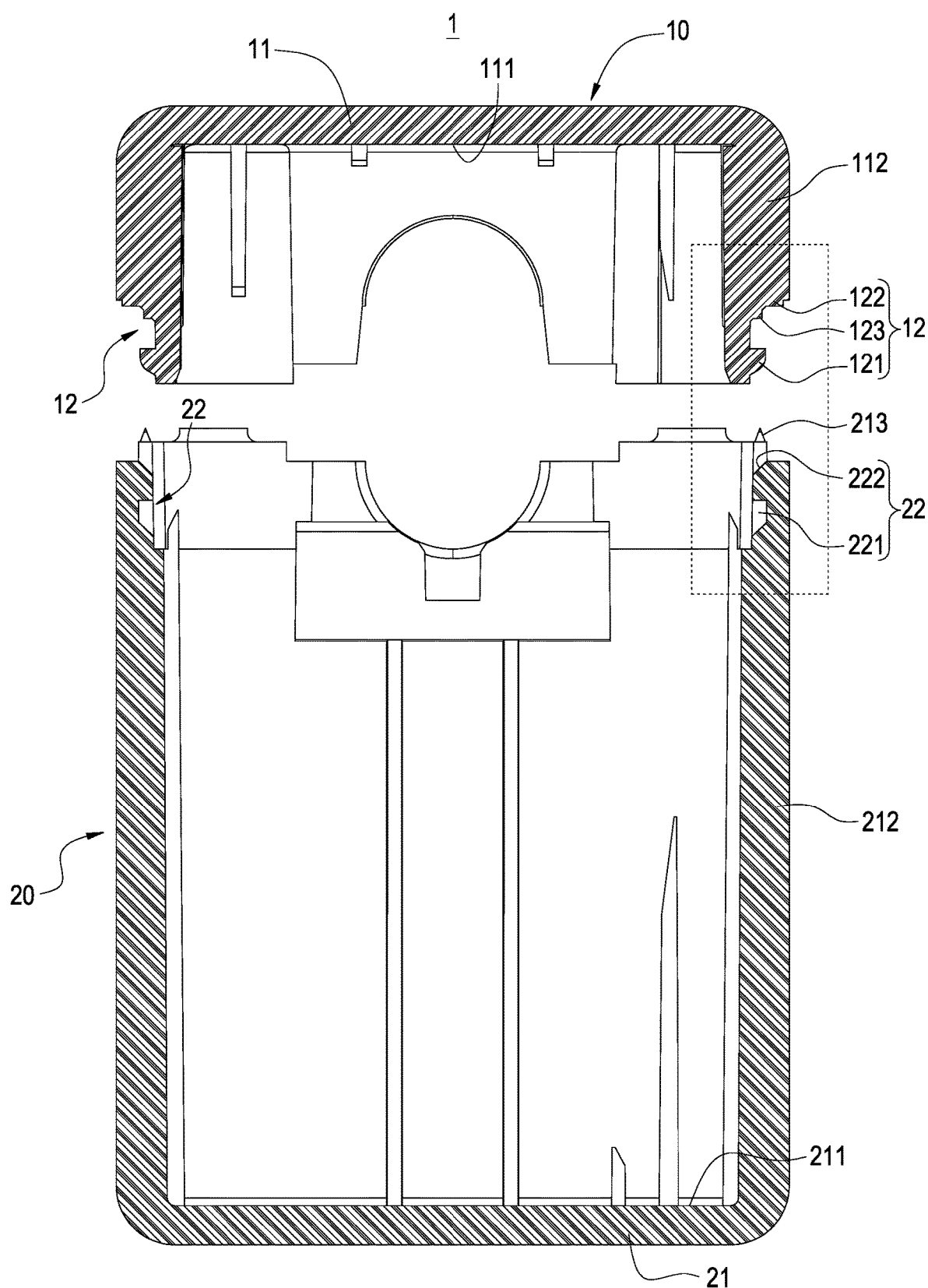
FIG. 3 is a cross sectional view of FIG. 1 taken along line 3-3 before assembly of the housing device of the present invention.
Figure 4:
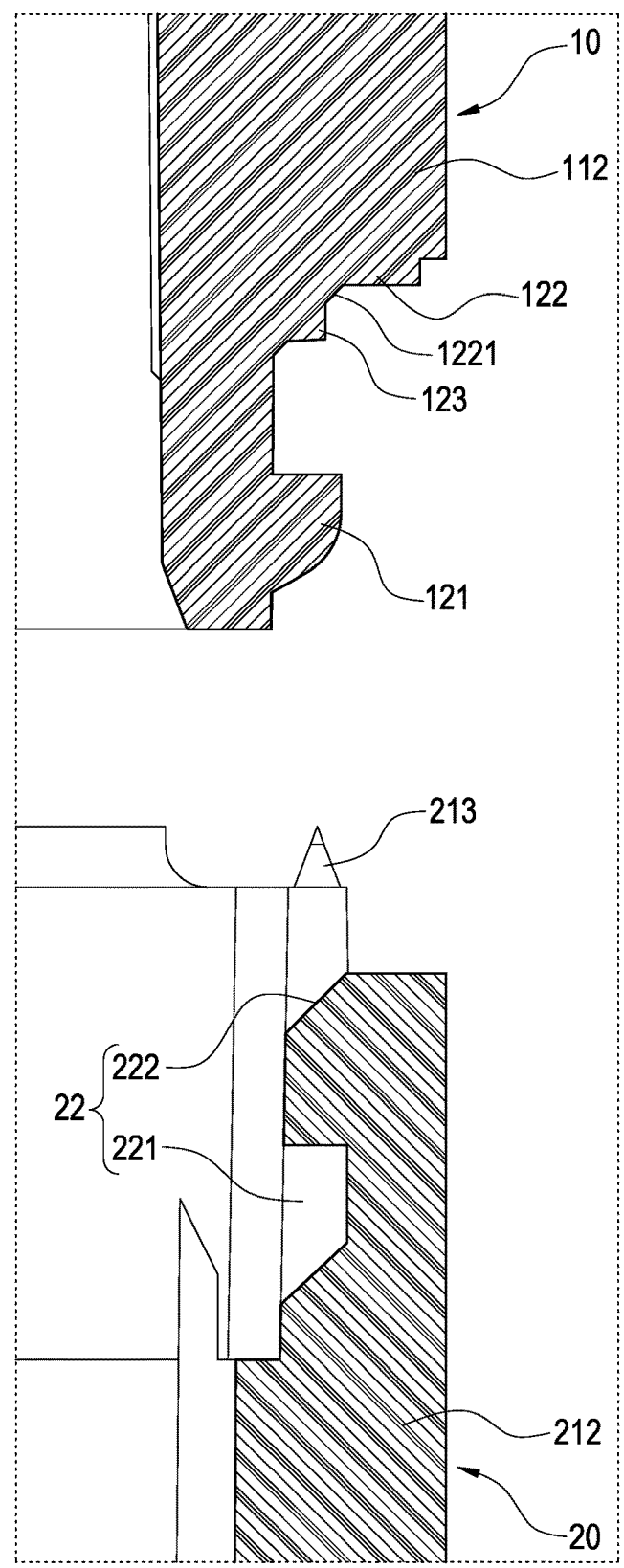
FIG. 4 is a partially enlarged schematic view of FIG. 3.

Please refer to FIG. 3 and FIG. 4, the FIG. 3 depicts a cross sectional view of FIG. 1 taken along line 3-3 before assembly of the housing device of the present invention (a cross-sectional view of the housing device at the position of the hook before assembly), and the FIG. 4 is a partially enlarged schematic view in FIG. 3. As shown in FIG. 3, the housing device 1 of the present invention includes a second housing body 20 which is combined with the first housing body 10. The second housing body 20 includes a second housing seat 21 and a second combination structure 22 disposed on the second housing seat 21.

Moreover, the second housing seat 21 has a second bottom surface 211 and a second wall 212, and the second wall 212 is extended from the second bottom surface 211 in a direction away from the second bottom surface 211. In addition, the second housing body 20 has provided a second bump 213 as an energy director on a top surface of the second wall 212.

With referring FIG. 4, the second combination structure 22 includes a slot 221 disposed at the second wall 212 and an abutting block 222 located at a side of the slot 221. The combination of the first housing body 10 and the second housing body 20 will be described in detail later.

Figure 5:
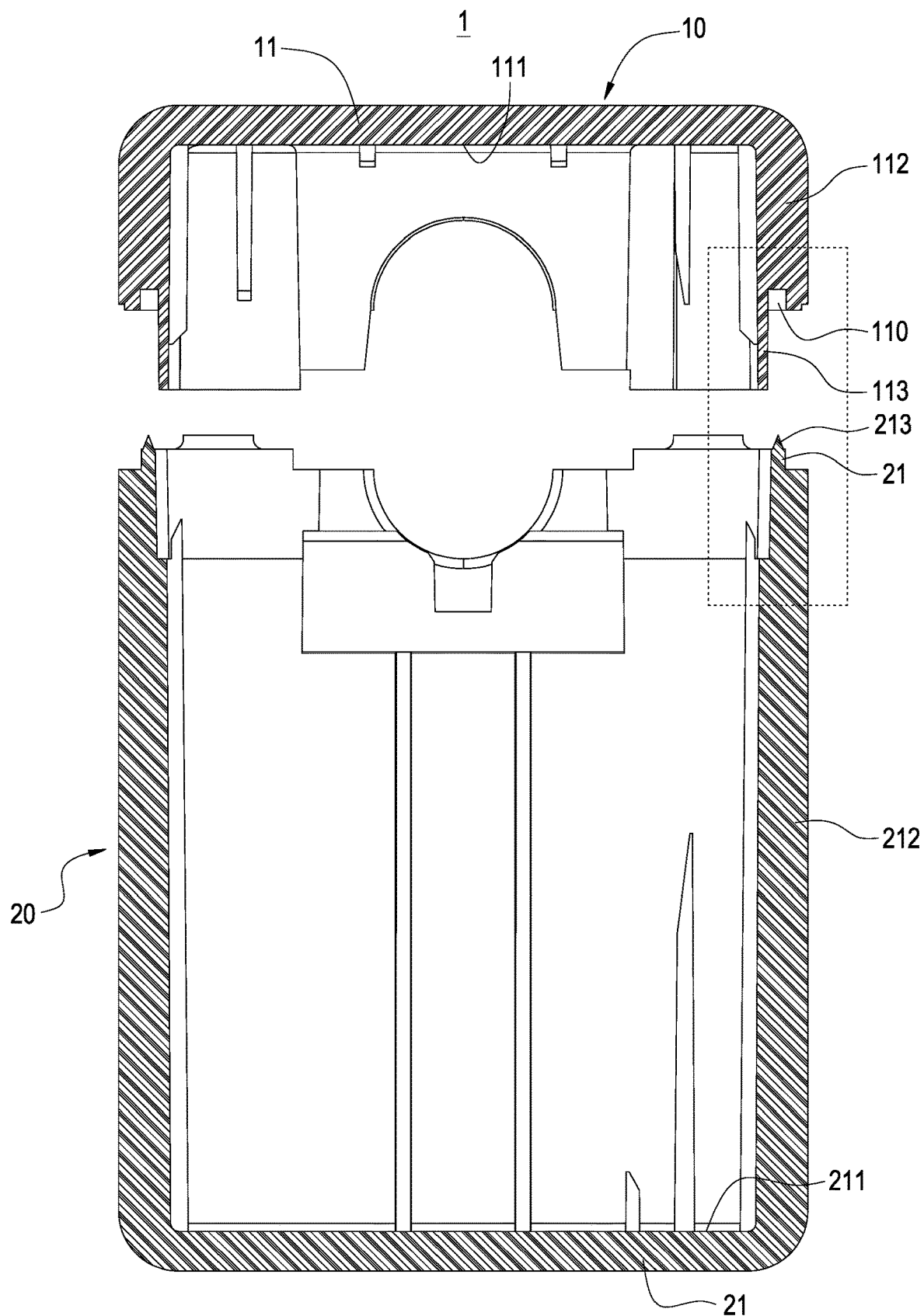
FIG. 5 is a cross sectional view of FIG. 1 taken along line 5-5 before assembly of the housing device the present invention.
Figure 6:
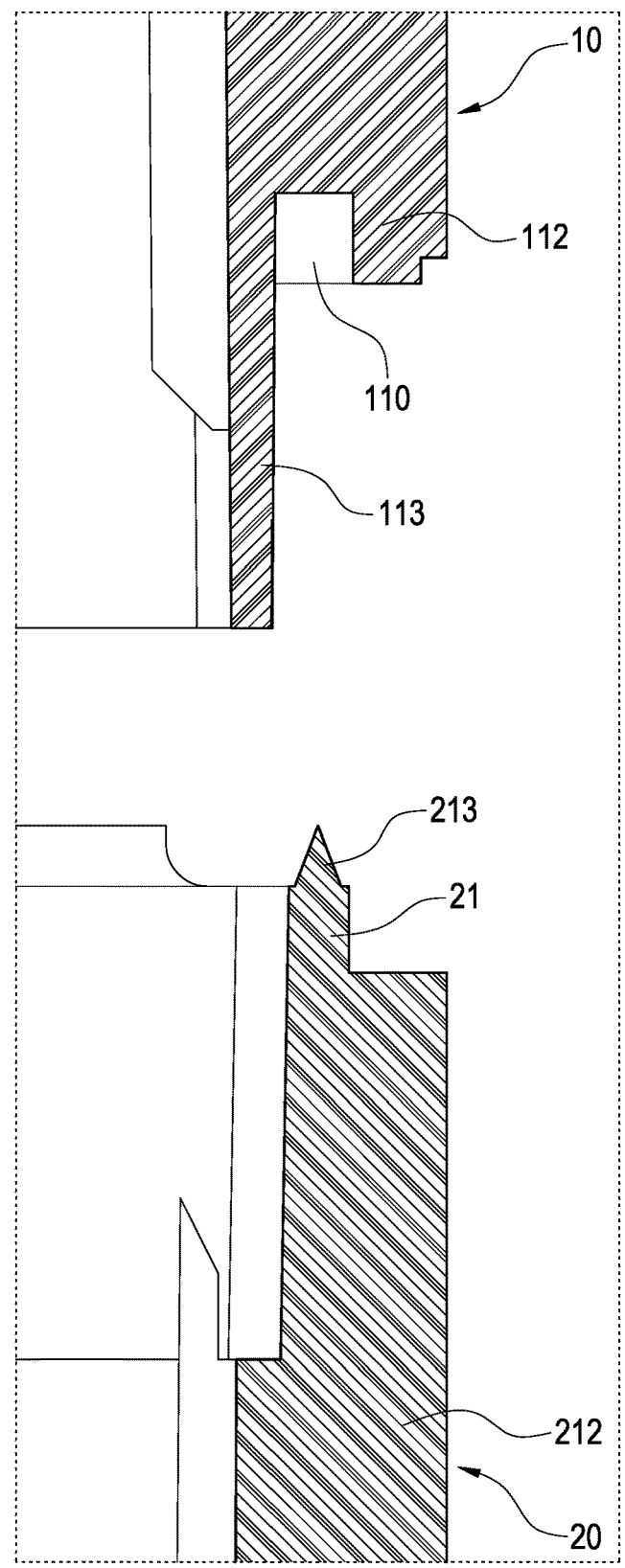
FIG. 6 is a partially enlarged schematic view in FIG. 5.

Please also refer to FIG. 5 and FIG. 6. FIG. 5 depicts a cross sectional view of FIG. 1 taken along line 5-5 before assembly of the housing device of the present invention (a cross-sectional view of the housing device of the present invention before assembly at the position without the hooks), and FIG. 6 is a partially enlarged schematic view in FIG. 5. In an embodiment of the present invention, the second housing body 20 is provided with a second bump 213 on the top surface of the second wall 212. On the other hand, the first housing body 10 is provided with a groove 110 between the extension wall 113 and the first wall 112. Thereby, when the first housing body 10 and the second housing body 20 are combined with each other, the second bump 213 of the second housing body 20 is inserted in the groove 110 of the first housing body 10 for positioning.

Figure 7:
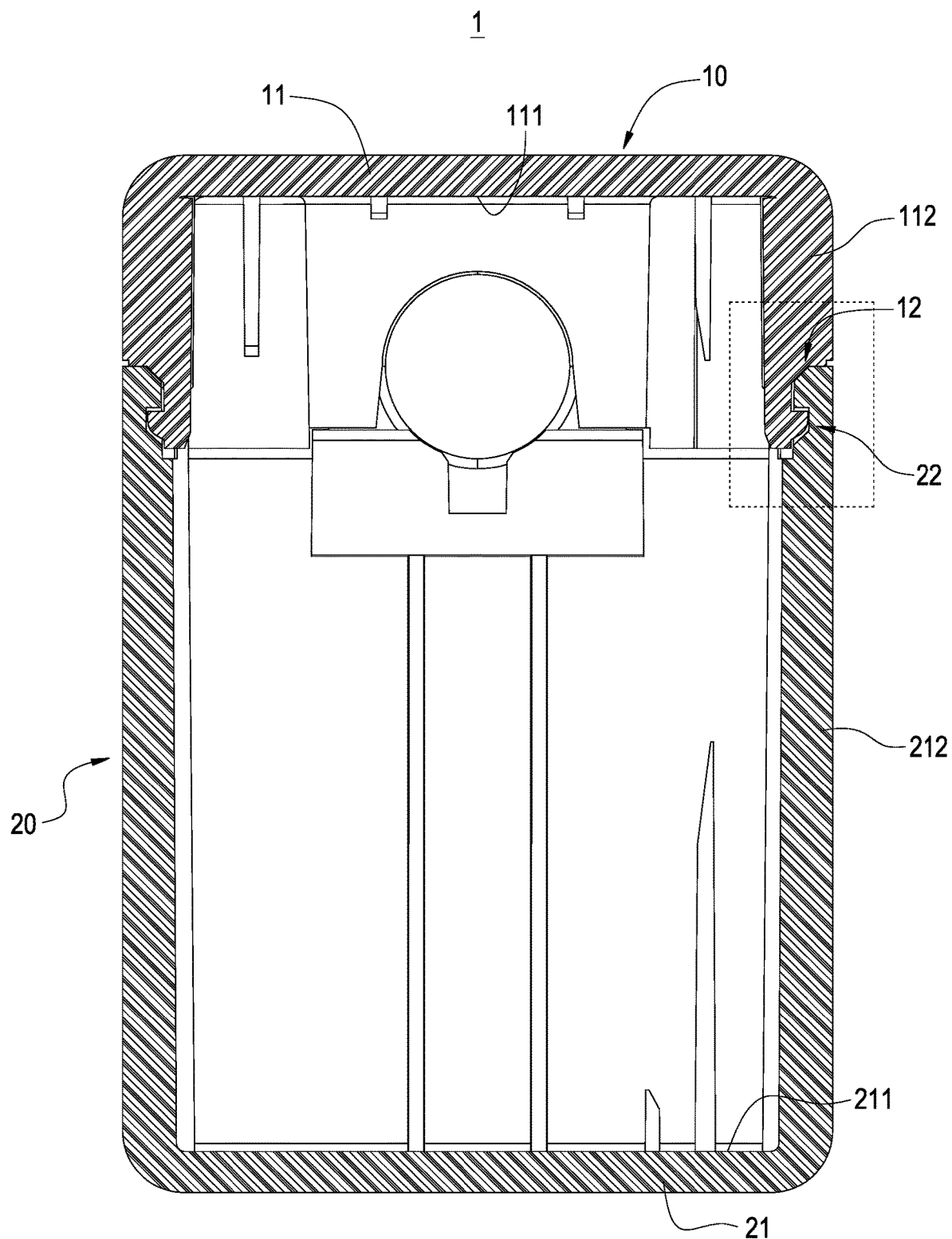
FIG. 7 is a cross sectional view of FIG. 3 after assembly of the housing device of the present invention.
Figure 8:
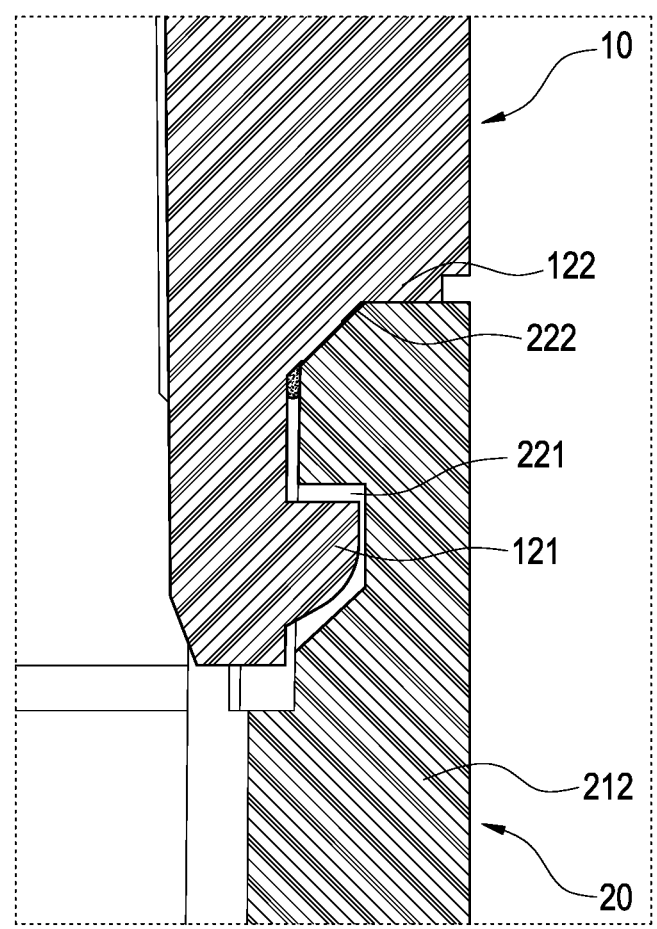
FIG. 8 is a partially enlarged schematic view in FIG. 7.

Please further refer to FIG. 7 and FIG. 8, the FIG. 7 depicts a cross sectional view of FIG. 1 taken along line 3-3 of the housing device after assembly (a cross-sectional view of the housing device after assembly), and the FIG. 8 is a partially enlarged schematic view in FIG. 7. As shown in FIG. 7, when the first housing body 10 combines with the second housing body 20, the first housing body 10 and the second housing body 20 are combined through the first combination structure 12 and the second combination structure 22 for positioning to facilitate the ultrasonic welding. In the embodiment, the second housing body 20 engages with the hooks 121 of the first housing body 10 through the slots 221 and abuts against the base 122 of the first housing 10 through the abutting block 222 to position with the first housing body 10.

Subsequently, as shown in FIG. 8, the first housing body 10 and the second housing body 20 are held together by ultrasonic welding. The base 122 and the abutting block 222 are bonded through melting the first bump 123. Therefore, when the first housing body 10 and the second housing body 20 of the present invention are combined, the ultrasonic welding can still be performed where the first housing body 10 is provided with hooks 121.

Figure 9:
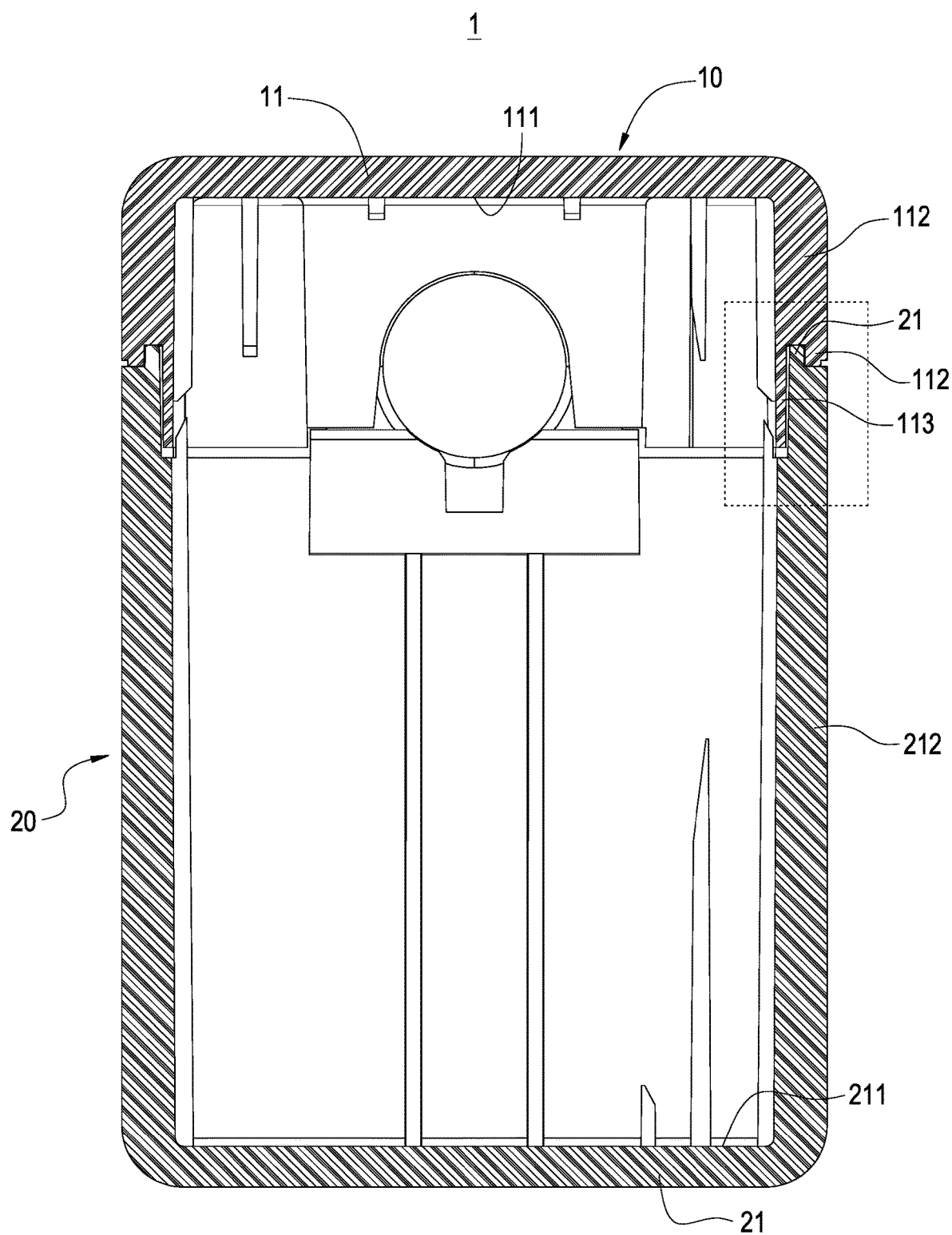
FIG. 9 is a cross sectional view of FIG. 5 after assembly of the housing device of the present invention.
Figure 10:
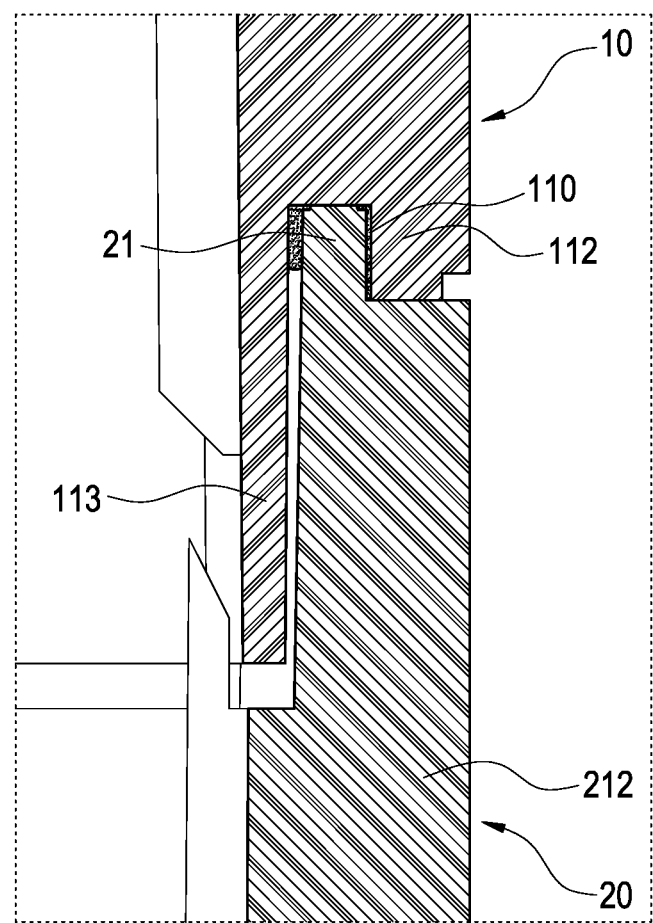
FIG. 10 is a partially enlarged schematic view in FIG. 9.

Please also refer to FIG. 9 and FIG. 10. FIG. 9 depicts a cross sectional view of FIG. 1 taken along line 5-5 after assembly of the housing device with combination structures of the present invention (a cross-sectional view of the housing device after assembly at the position without hooks), and FIG. 10 is a partially enlarged schematic view in FIG. 9. When the first housing body 10 and the second housing body 20 are combined by ultrasonic welding, the second bump 213 of the second housing body 20 is inserted in the groove 110 of the first housing body 10 for ultrasonic welding and bonded through melting the second bump 213 where the first wall 112 and the second wall 212 are not provided with hooks 121. Thereby, the ultrasonic welding can be performed at the entire circumference between the first housing body 10 and the second housing body 20, and the bonding strength therebetween will be enhanced.

Figure 11:
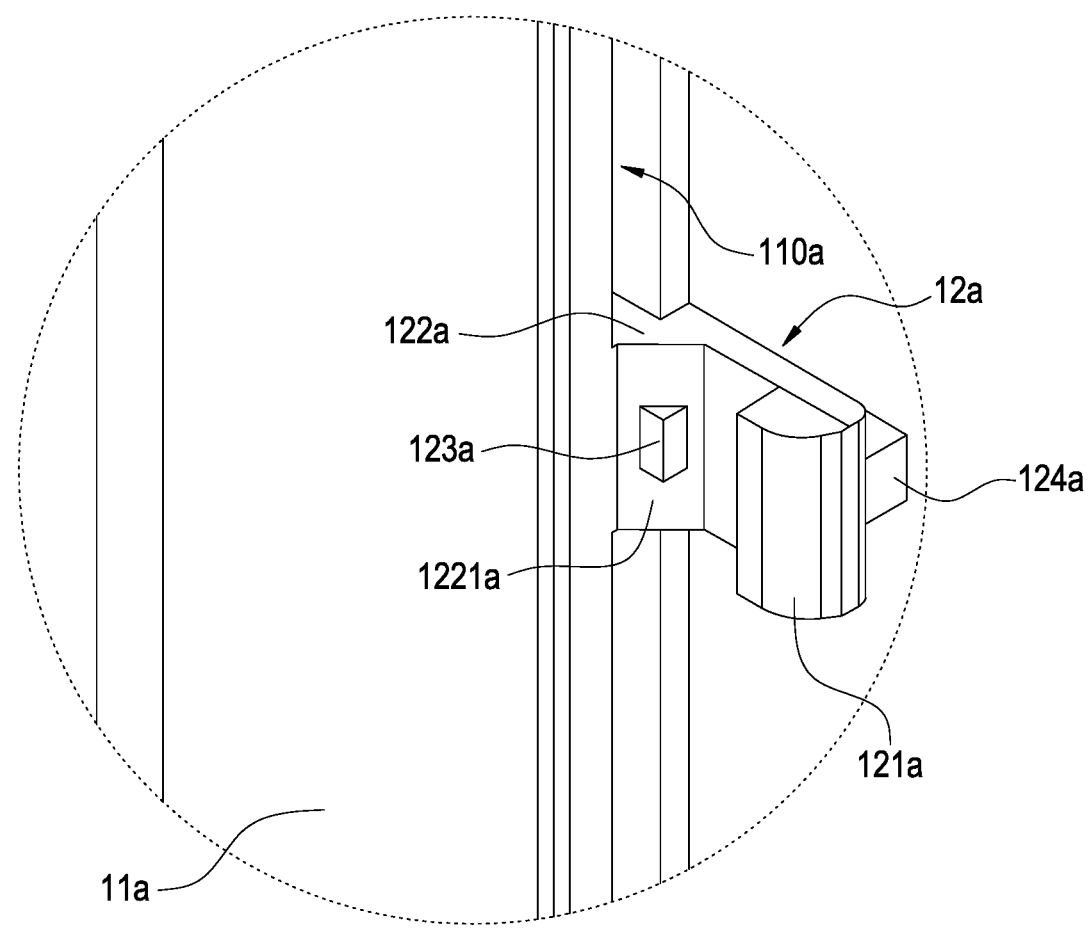
FIG. 11 is another embodiment of the hook of the first housing body of the present invention.
Figure 12:
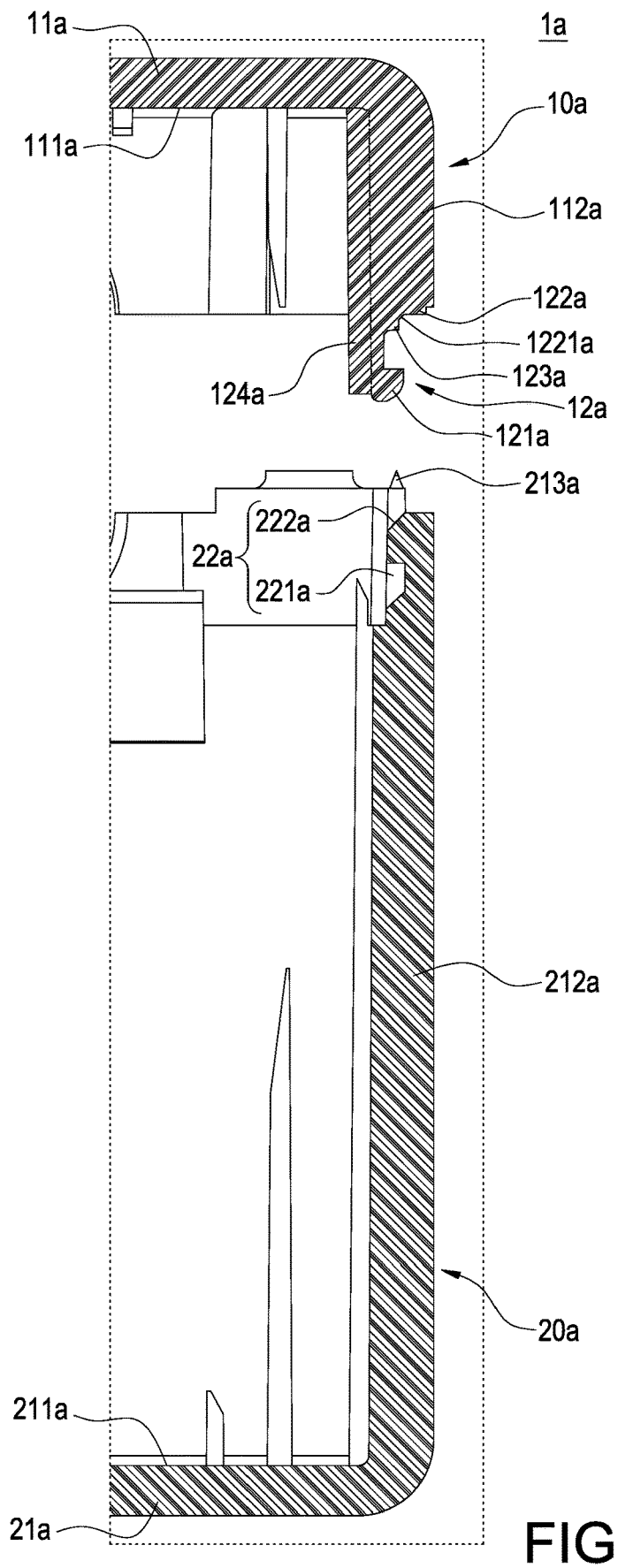
FIG. 12 is a combination schematic view of another embodiment of the hook of the first housing body applied to the housing device of the present invention.

Please refer to FIG. 11 and FIG. 12, which depict another embodiment of the hook of the first housing body of the present invention and a combination schematic view of another embodiment of the hook of the first housing body applied to a housing device. In an embodiment of the present invention, a housing device 1a includes a first housing body 10a and a second housing body 20a. The first housing body 10a comprises a first housing seat 11a and a first combination structure 12a. The first housing seat 11a has a first bottom surface 111a and a first wall 112a. The first combination structure 12a includes a hook 121a, a base 122a and a first bump 123a provided as an energy director. Moreover, this embodiment is substantially the same as the previous embodiment, and the difference lies in the manner in which the hook 121a is disposed.

In the embodiment, the hook 121a protrudes from the first wall 112a. The base 122a is protruded from the first wall 112a and located below the hook 121a correspondingly; besides, the first bump 123a is disposed on the base 122a. Preferably, the base 122a has an inclined surface 1221a, and the first bump 123a is disposed on the inclined surface 1221a.

Specifically, the first housing seat 11a has a groove 110a located at an outer side of the first wall 112a. The first combination structure 12a further includes a reinforcing rib 124a located at a position corresponding to the hook 121a for increasing the structural strength of the hook 121a.

As shown in FIG. 12, in the present embodiment, the second housing body 20a includes a second housing seat 21a and a second combination structure 22a. The second housing seat 21a has a second bottom surface 211a and a second wall 212a. The second wall 212a is extended from the second bottom surface 211a in a direction away from the second bottom surface 211a. In addition, a top surface of the second wall 212a is provided with a second bump 213a as an energy director, and the second bump 213a is embedded in the groove 110a of the first housing body 10a.

Furthermore, the second combination structure 22a includes a slot 221a disposed at the second wall 212a and an abutting block 222a located at a side of the slot 221a.

In the present embodiment, the second housing body 20a engages the hook 121a of the first housing body 10a through the slot 221a and abuts the base 122a of the first housing body 10a through the abutting block 222a to position with the first housing body 10a. Subsequently, the first housing body 10a and the second housing body 20a are held together by ultrasonic welding, and that is the same as the previous embodiment; therefore, the details are not described herein again.

Although the present invention has been described with reference to the preferred embodiment thereof, it will be understood that the invention is not limited to the details thereof. Various substitutions and improvements have been suggested in the foregoing description, and others will occur to those of ordinary skill in the art. Therefore, all such substitutions and improvements are intended to be embraced within the scope of the invention as defined in the appended claims.

What is claimed is:

1. A housing device with combination structures including a first housing body, the first housing body comprising:
   a first housing seat having a first bottom surface, a first wall, an extension wall, and a groove located between the extension wall and the first wall, the first wall and the extension wall respectively extended from the first bottom surface in a direction away from the first bottom surface, and the extension wall located at an inner side of the first wall and being higher than the first wall;
   a first combination structure including a hook, a base and a first bump provided as an energy director; the hook disposed at a side of the extension wall facing the first wall; the base protruded from the first wall and located below the hook correspondingly, and the first bump disposed on the base; and
   a second housing body, the second housing body including:
   a second housing seat having a second bottom surface and a second wall, the second wall extended from the second bottom surface in a direction away from the second bottom surface; a top surface of the second wall being provided with a second bump as an energy director, and the second bump embedded in the groove of the first housing body; and
   a second combination structure including a slot disposed at the second wall and an abutting block located at a side of the slot.

2. The housing device with combination structures according to claim 1, wherein the base has an inclined surface, and the first bump is disposed on the inclined surface.

3. The housing device with combination structures according to claim 1, wherein the first combination structure further includes a reinforcing rib positioned at a side of the extension wall away from the first wall and disposed at a location corresponding to the hook.

4. The housing device with combination structures according to claim 3,
   wherein the second housing body engages the hook of the first housing body through the slot and abuts the base of the first housing body through the abutting block.

5. The housing device with combination structures according to claim 4, wherein the first housing body and the second housing body are held together by ultrasonic welding; the base and the abutting block are bonded through melting the first bump; the first wall and the second wall are bonded through melting the second bump.

6. A housing device with combination structures including a first housing body, the first housing body comprising:
   a first housing seat having a first bottom surface, a first wall, and a groove located at an outer side of the first wall, the first wall extended from the first bottom surface in a direction away from the first bottom surface;
   a first combination structure including a hook, a base and a first bump provided as an energy director; the hook protruding from the first wall; the base protruded from the first wall and located below the hook correspondingly, and the first bump disposed on the base; and
   a second housing body, the second housing body including:
   a second housing seat having a second bottom surface and a second wall, the second wall extended from the second bottom surface in a direction away from the second bottom surface; a top surface of the second wall being provided with a second bump as an energy director, and the second bump embedded in the groove of the first housing body; and
   a second combination structure including a slot disposed at the second wall and an abutting block located at a side of the slot.

7. The housing device with combination structures according to claim 6, wherein the base has an inclined surface, and the first bump is disposed on the inclined surface.

8. The housing device with combination structures according to claim 6, wherein the first combination structure further includes a reinforcing rib located at a position corresponding to the hook.

9. The housing device with combination structures according to claim 8,
   wherein the second housing body engages the hook of the first housing body through the slot and abuts the base of the first housing body through the abutting block.

10. The housing device with combination structures according to claim 9, wherein the first housing body and the second housing body are held together by ultrasonic welding; the base and the abutting block are bonded through melting the first bump; the first wall and the second wall are bonded through melting the second bump.

* * * * *